(12) United States Patent
Gauche et al.

(10) Patent No.: US 7,501,699 B2
(45) Date of Patent: Mar. 10, 2009

(54) METHOD AND APPARATUS FOR ELECTRICAL ISOLATION OF SEMICONDUCTOR DEVICE

(75) Inventors: Paul Gauche, Portland, OR (US); Rajiv Mongia, Portland, OR (US); Alex Waizman, Portland, OR (US); Efraim Rotem, Israel (IL)

(73) Assignee: Intel Corporation, Santa Clara, CA (US)

( * ) Notice: Subject to any disclaimer, the term of this patent is extended or adjusted under 35 U.S.C. 154(b) by 286 days.

(21) Appl. No.: 11/173,146

(22) Filed: Jun. 30, 2005

(65) Prior Publication Data

US 2007/0023892 A1   Feb. 1, 2007

(51) Int. Cl.
*H01L 23/34* (2006.01)

(52) U.S. Cl. .................. 257/712; 257/714; 257/717
(58) Field of Classification Search .......... 257/706–722
See application file for complete search history.

(56) References Cited

U.S. PATENT DOCUMENTS

| 7,254,032 B1 * | 8/2007 | Xue et al. ................. 257/707 |
| 2002/0144804 A1 * | 10/2002 | Liang et al. ............ 165/104.33 |

* cited by examiner

*Primary Examiner*—Cuong Q Nguyen
(74) *Attorney, Agent, or Firm*—Schwegman, Lundberg & Woessner, P.A.

(57) ABSTRACT

A package includes a thermal solution to thermal couple to a semiconductor device to remove heat generated by the semiconductor device, and a device to electrically isolate at least a portion of the thermal solution from the semiconductor device. The package also includes a biasing device to apply a voltage to a body of the semiconductor device.

11 Claims, 7 Drawing Sheets

METHOD AND APPARATUS FOR ELECTRICAL ISOLATION OF SEMICONDUCTOR DEVICE

BACKGROUND

There is an industry push toward reducing power consumption in computer systems. For example, some government bodies require energy compliant computing systems. The need for reducing the power consumption of computers is especially keen for battery-operated mobile computing systems, such as laptops or notebook personal computers. Because the power source of mobile computers accounts for a significant percentage of the bulk and weight of the device, attempts have been made since the advent of laptops to reduce their power consumption.

In addition, there is an ever-constant push in the computing industry to deliver computing systems having increased computing performance. Mobile computers, such as laptop and notebook computers, are not immune to the ever-constant push to deliver higher performing systems. In mobile computers, such as a laptop or notebook computer, there is also an ever constant push to manage power to maintain or increase the time between battery rechargings. In mobile computing environments, power management is also important since it is related to the amount of heat generated. Generally, the higher the amount of power consumed, the more heat that will be generated. In mobile computers, the components are packed into a smaller housing so any heat generated is concentrated within the smaller housing and must be managed more effectively to prevent device or component failure.

Power consumption of a semiconductor device or component includes not only the active power used by a component or device, but also includes the leakage power consumed by a component or device. Leakage power results from leakage current. Leakage current is inherent in devices or components that include transistors. Leakage current is current that conducts through a transistor even when the transistor is supposed to be off. In most circuit configurations, leakage current is undesirable because it consumes power without producing useful work. Leakage power consumption is inherent in semiconductor physics and is a product of the design methods used to create high speed processors. Leakage power consumption is caused by a voltage gradient across a junction within a semiconductor chip that causes current flow.

Currently, high performance devices are experiencing larger leakage currents as a percentage of total current consumption because of the greater number of transistors, with each transistor having a larger leakage current. The development of high performance devices or components, such as microprocessors, has lead to increased leakage power consumption because higher frequency devices employ smaller transistors in larger numbers than ever before. The smaller the transistor channel length and oxide thickness, the greater the leakage power consumption.

BRIEF DESCRIPTION OF THE DRAWINGS

A better understanding of the present invention can be obtained from the following detailed description in conjunction with the following drawings, in which.

DESCRIPTION OF PREFERRED EMBODIMENTS

In the following detailed description of the preferred embodiments, reference is made to the accompanying drawings that form a part hereof, and in which are shown by way of illustration specific embodiments in which some embodiments of the invention may be practiced. It is understood that other embodiments may be utilized and structural changes may be made without departing from the scope of the present invention.

Figure 1:
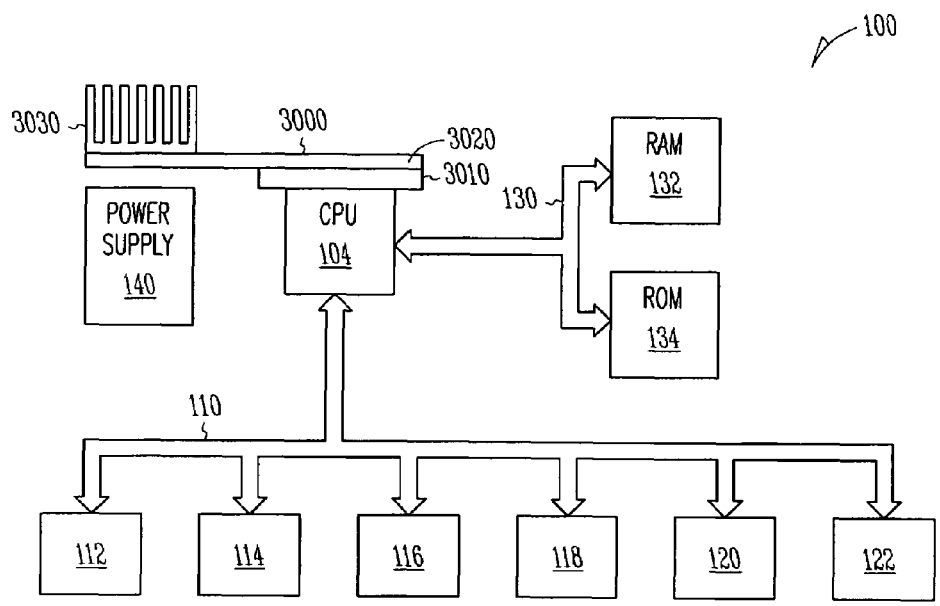
FIG. 1 is a schematic view of a thermal solution for a computing system, according to an example embodiment.

FIG. 1 is a schematic view of a system 100, such as a computer system 100, according to an example embodiment. The computer system 100 may also be called an electronic system or an information handling system and includes a central processing unit 104, a random access memory 132, a read only memory 134, and a system bus 130 for communicatively coupling the central processing unit 104, the random access memory 132 and the read only memory 134. The information handling system 100 also includes an input/output bus 110. One or more peripheral devices, such as peripheral devices 112, 114, 116, 118, 120, and 122 may be attached to the input/output bus 110. Peripheral devices may include hard disc drives, magneto optical drives, floppy disc drives, displays, monitors, keyboards and printers, scanners, fax machines, or any other such peripherals. The information handling system 100 includes a power supply 140. In the case of a mobile information handling system 100, the power supply 140 can include a battery which delivers power at a specific level to the central processing unit 104, the random access memory 132, and the read only memory 134. In some embodiments, the battery also supplies power at a specific level to one or more of the peripherals 112, 114, 116, 118, 120, 122. A mobile information handling system 100, in some embodiments, also includes a transformer for transforming alternating current to direct current that can be used in place of the battery or can be used to charge the battery associated with the power supply 140. In another example embodiment, the information handling system 100 is designed to run primarily on alternating current. These types of systems, such as a desktop computer or the like, include a power supply that transforms current from an alternating current source to voltage at a level for delivery to the central processing unit 104, the random access memory 132, and the read only memory 134. In some embodiments, the power supply 140 also supplies power at a specific level to one or more of the peripherals 112, 114, 116, 118, 120, 122.

Attached to the central processing unit 104 is a thermal solution 3000, according to an example embodiment. The thermal solution 3000 includes an attach block 3010 attached to the central processing unit 104, and a thermal transport device 3020 attached to the attach block. The thermal solution 3000 also includes a heat exchanger 3030 which is thermally attached to the thermal transport device 3020. The thermal solution 3000 will be described in further detail in the discussion that follows. It should be noted that even though the computing system 100 shows the thermal solution 3000 attached to one of the components or devices, the thermal solution can be attached to a plurality of the components or devices associated with a computing system 100. It should be noted that the information handling system or computer system 100 described above is one example embodiment of a computer system. Other computer systems can include multiple central processing units and multiple memory units each including the thermal solution 3000.

Figure 2:
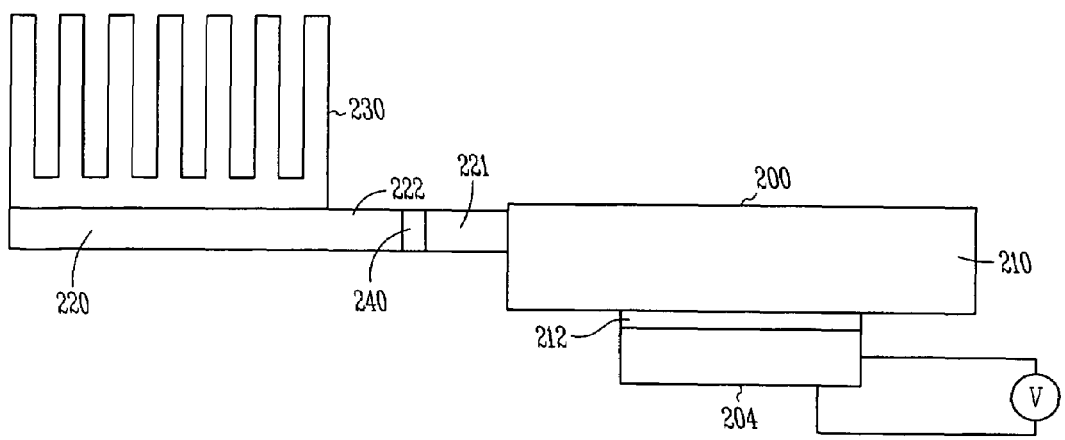
FIG. 2 is a schematic view of a thermal solution attached to a device, according to an example embodiment.

FIG. 2 is a schematic view of a thermal solution 200 attached to a device 204, according to an example embodiment. The thermal solution 200 includes an attach block 210, a thermal transport device 220, and a remote heat exchanger 230. The attach block 210 is attached to the device 204 with a thermal interface material 212. A thermal interface material (TIM) is material which fills in spaces or gaps at the interface between the semiconductor device 204 and the attach block 210. TIMs can include pastes, thermal grease, epoxies, phase change materials or the like. The thermal transport device 220 is attached to the attach block 210. The remote heat exchanger 230 is also attached to the thermal transport device 220. The attach block 210 is attached at one end of the thermal transport device 220 and the remote heat exchanger 230 is attached at another end of the thermal transport device 220. The thermal transport device 220 can include any device used to move heat from the attach block to the remote heat exchanger 230. In some embodiments, the thermal transport device may include a heat pipe which includes a fluid which moves heat from the attach block 210 to the remote heat exchanger 230. The coolant or fluid within such a heat pipe may even change phases as it is heated and cooled through a heat pipe.

As shown in FIG. 2, the thermal transport device 220 includes an insulative or insulated connection 240. The insulated connection 240 breaks the heat transport device 220 into a first portion 221 and a second portion 222. Thus, the insulative connection 240 substantially electrically isolates the semiconductor device 204, the attach block 210, and the first portion of the heat transport device 221 from the second portion 222 of the heat transport device 220 and the remote heat exchanger 230. As a result, a voltage V may be applied to the semiconductor device 204 and to the attach block 210 to bias the body of the semiconductor device 204 to substantially reduce or prevent leakage current in the semiconductor device 204 and the leakage power associated with the leakage current. As a result, the semiconductor device 204, the attach block 210, and the first portion 221 of the heat transport device 220 can have a voltage applied without worrying about connections to ground by or from the second portion 222 of the heat transport device 220 or ground connections associated with the remote heat exchanger 230.

Figure 3:
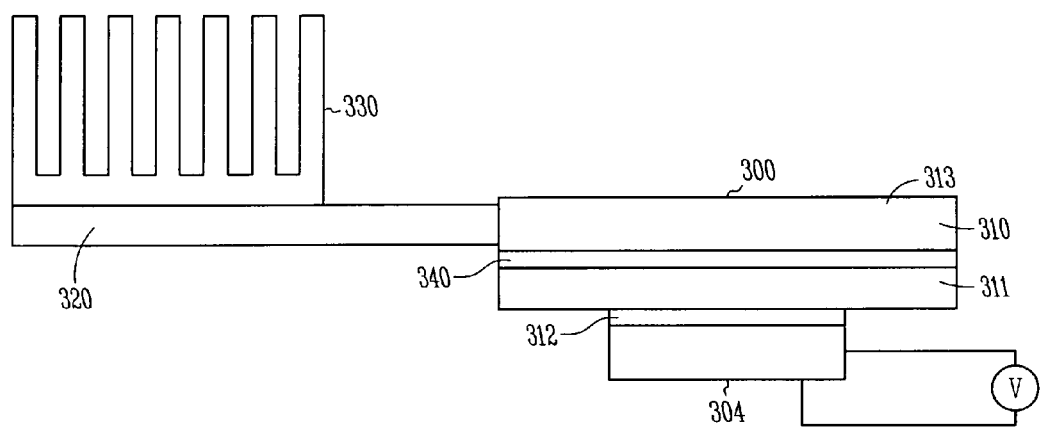
FIG. 3 is a schematic, view of another thermal solution attached to a device, according to an example embodiment.

FIG. 3 is a schematic view of another thermal solution 300 attached to a device 304, according to an example embodiment. The thermal solution includes an attach block 310, a thermal transport device 320, and a remote heat exchanger 330. The attach block 310 is attached to the semiconductor device 304 using a thermal interface material 312. The thermal transport device 320 is attached at one end to the attach block 310 and is attached at another end to the remote heat exchanger 330. The thermal transport device can be any device which transports heat, including a heat pipe which includes a fluid or other coolant which is used to move heat from one area to another area. The attach block 310 is actually divided into a first attach block portion 311 and a second attach block portion 313. An electrical insulator 340 is positioned between the first portion 311 of the attach block 310 and the second portion 313 of the attach block 310. It should be noted that in FIG. 3, the first portion 311 and second portion 313 are of similar size and shape. In another embodiment, the shapes and sizes of the first portion 311 and second portion 313 can be different. The electrical insulator 340 isolates the semiconductor device 304 and the first portion 311 of the attach block 310 from the second portion 313 of the attach block 310, the heat transport device 320, and the remote heat exchanger 330.

As a result, a voltage can be applied to the semiconductor device 304 and the first portion 311 of the attach block 310 to reduce or eliminate leakage current in the semiconductor device 304. The insulator or insulated device 340 which separates the first portion 311 of the attach block 310 from the second portion 313 of the attach block 310, allows the second portion 313 of the attach block 310, the heat transport device 320, and the remote heat exchanger 330 to be grounded without affecting the ability to apply a voltage to the semiconductor 304 and the first portion 311 of the attach block 310. In many instances, a material that is electrically insulative may not be a good thermal conductor. However, by providing an electrically insulative layer between a first portion 311 and a second portion 313 of the attach block 310, the amount of thermal resistance is lessened. In order to lessen the amount of thermal resistance, the thermal attach block may be separated to produce a maximum amount of surface area between the first portion 311 and the second portion 313 of the attach block 310. The first portion 311 and the second portion 313 of the attach block 310 are then bonded with a thin electrical insulating layer 340. A thinner electrical insulative layer is less resistant to thermal conductivity than a thicker insulative layer 340. The insulating layer can include any material having electrical insulative properties including aluminum nitride, silicon nitride, diamond or the like. Resistance is determined by the following formula:

$R = t/KA [° C/W]$

Where t=thickness of the insulation [m]

K=conductivity of insulation [W/mK]

A=Area conducted through [m^2]

From the above formula it can be seen that by increasing the area is inversely proportional to the thermal resistance, R. In order to overcome power density from the semiconductor device 304 which will increase the thermal resistance, R, the first portion 311 of the attach block 310 and the second portion 313 of the attach block 310 should be made of a material having a high thermal conductivity. One such material is copper. Other materials include other high thermal conductivity materials including aluminum, other metals, or graphite. Another option is that the first portion 311 of the thermal attach block 310 and the second portion 313 of the thermal attach block 310 could be also highly thermally conductive if they include vapor chambers associated with a heat pipe. In another embodiment, the first portion 311 and second portion 313 are designed to be different sizes and shapes in order to facilitate assembly or mechanical constraints as opposed to maximization of surface area.

Figure 4:
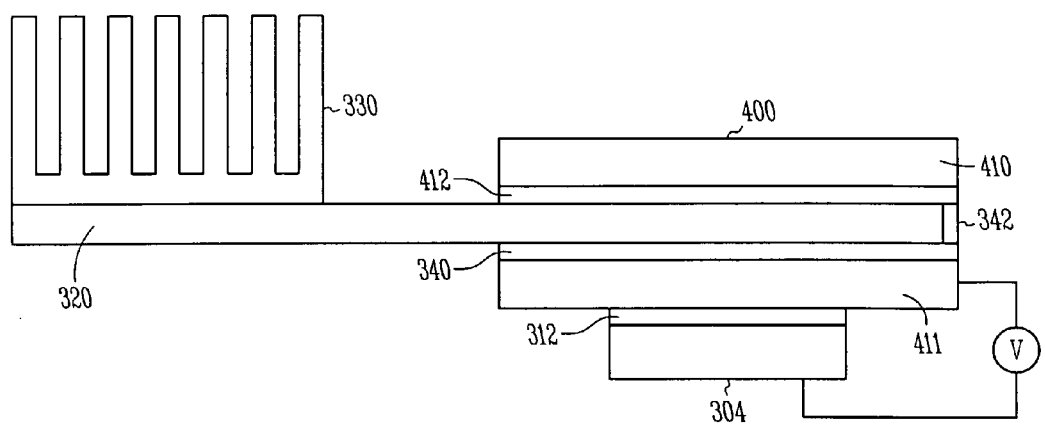
FIG. 4 is a schematic view of yet another thermal solution attached to a device, according to an example embodiment.

FIG. 4 is a schematic view of yet another thermal solution 400 attached to a device 304, according to an example embodiment. Many of the elements of FIG. 3 are similar to the elements of FIG. 4. Therefore, rather than discuss all of the elements of FIG. 4, only the elements that differ will be discussed for the sake of brevity and clarity. The attach block 410 is attached to the semiconductor device 304 using a TIM 312. The thermal transport device 320 is attached to the first portion 411 and the second portion 412 of the thermal attach block 410 by way of insulative portions 340 and 342, respectively. The insulative portions 340 and 342 are thin layers of insulative material which are used to bond the first portion 411 and the second portion 412 to the thermal transport device 320.

As can be seen, the surface, A, through which heat is conducted is increased when compared to the thermal solution 300 shown in FIG. 3. This will further reduce the thermal resistance, R, associated with thermal solution 400 when compared to thermal solution 300. It should be noted that the first portion 411 and the second portion 412 of the thermal attach block 410 are thermally connected so that heat from the semiconductor device 304 travels through the attach block 410 to both the first portion 411 and the second portion 412 of the thermal attach block 410.

Figure 5A:
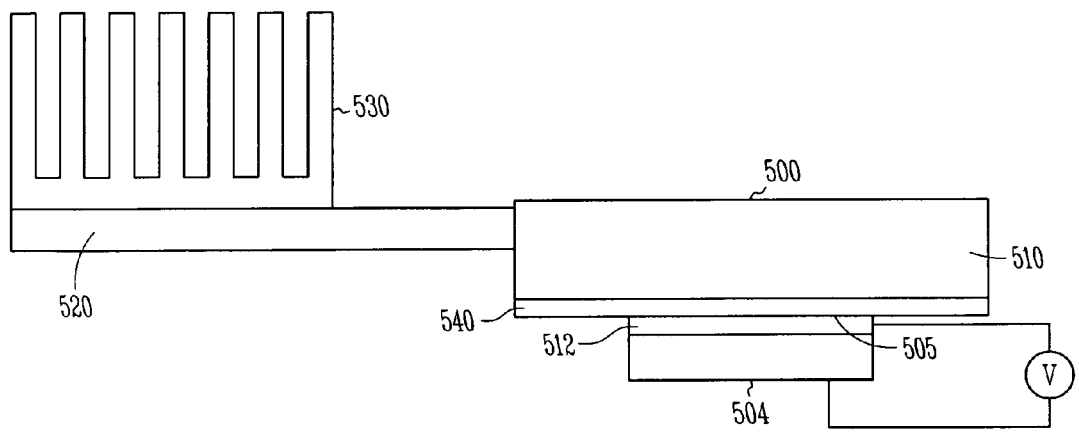
FIG. 5A is a schematic view of still another thermal solution attached to a device, according to an example embodiment.

FIG. 5A is a schematic view of still another thermal solution 500 attached to a semiconductor device 504, according to an example embodiment. The thermal solution 500 includes an attach block 510, a thermal transport device 520, and a remote heat exchanger 530. The attach block 510 is attached to the semiconductor device 504 using a TIM 512. The TIM is located on surface 505 of the silicon device 504. A layer of electrical insulation 540 is also attached to at least a portion of the attach block 510 on the surface which interfaces with the surface 505 of the semiconductor device 504. The insulating layer can include any material having electrical insulative properties including aluminum nitride, silicon nitride, diamond or the like. The thermal transport device 520 is attached to the attach block 510 and the remote heat exchanger is attached to the thermal transport device 520. The electrical insulative layer 540 electrically insulates the semiconductor device 504 from the thermal solution 500.

As a result, a voltage can be applied to the semiconductor device 504 to substantially prevent or eliminate leakage current in the semiconductor device 504. The electrical insulative layer 540 electrically isolates the semiconductive device 504 from the remaining portions of the thermal solution 500. Therefore, if the thermal solution, including the attach block, the thermal transport device 520, or the remote heat exchanger 530 is grounded in any way, the grounding will not provide a short to ground for the current produced by applying the voltage that prevents or eliminates leakage current in the semiconductor device 504. The surface area, A, through which heat must flow from the semiconductor 504 to the attach block 510 is limited to the surface area 505 of a surface of the semiconductive device 504. As a result, this thermal solution 500 may have a higher resistance to thermal conductivity when compared with the thermal solutions 200, 300, and 400 (shown in FIGS. 2, 3, and 4).

Figure 5B:
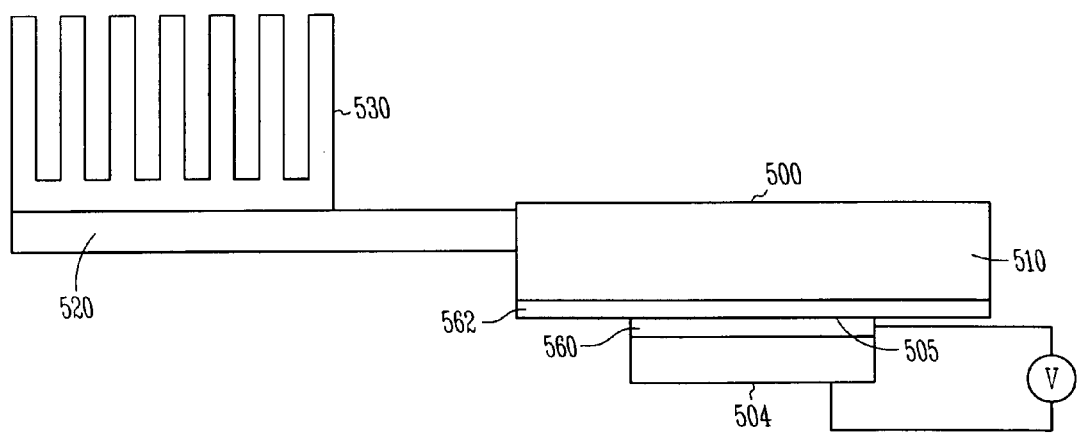
FIG. 5B is a schematic view of still another thermal solution attached to a device, according to an example embodiment.

FIG. 5B is a schematic view of still another thermal solution 550 attached to a semiconductor device 504, according to an example embodiment. The thermal solution 550 includes an attach block 510, a thermal transport device 520, and a remote heat exchanger 530. A layer of electrical insulation 560 is located on the surface 505 of the silicon device 504. The attach block 510 is attached to the semiconductor device 504 using a TIM 562. The TIM 562 is located on at least a portion of the attach block 510 on the surface which interfaces with the surface 505 of the semiconductor device 504. The insulating layer can include any material having electrical insulative properties including aluminum nitride, silicon nitride, diamond or the like. The thermal transport device 520 is attached to the attach block 510 and the remote heat exchanger is attached to the thermal transport device 520. The electrical insulative layer 560 electrically insulates the semiconductor device 504 from the thermal solution 550.

As a result, a voltage can be applied to the semiconductor device 504 to substantially prevent or eliminate leakage current in the semiconductor device 504. The electrical insulative layer 540 electrically isolates the semiconductive device 504 from the remaining portions of the thermal solution 550. Therefore, if the thermal solution, including the attach block, the thermal transport device 520, or the remote heat exchanger 530 is grounded in any way, the grounding will not provide a short to ground for the current produced by applying the voltage that prevents or eliminates leakage current in the semiconductor device 504. The surface area, A, through which heat must flow from the semiconductor 504 to the attach block 510 is limited to the surface area 505 of a surface of the semiconductive device 504. As a result, this thermal solution 500 may have a higher resistance to thermal conductivity when compared with the thermal solutions 200, 300, and 400 (shown in FIGS. 2, 3, and 4).

Figure 6:
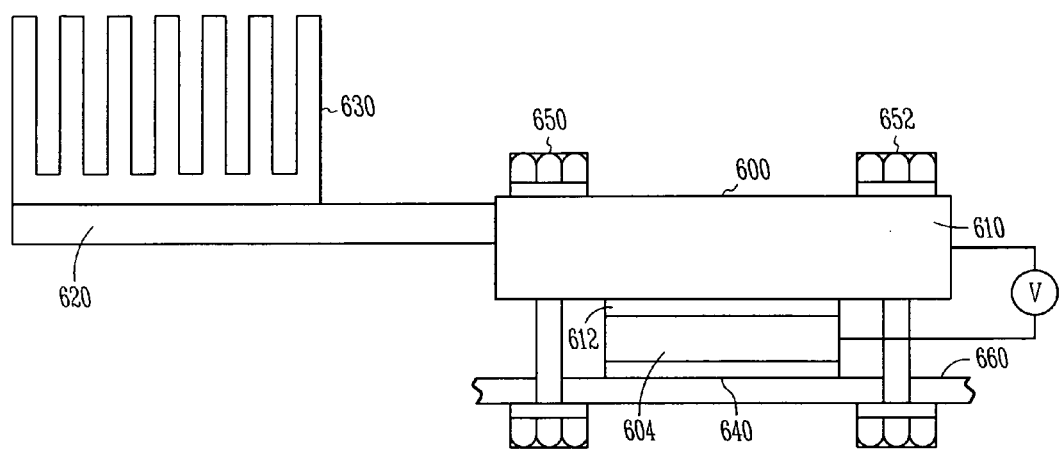
FIG. 6 is a schematic view of another thermal solution, according to an example embodiment.

FIG. 6 is a schematic view of another thermal solution 600, according to an example embodiment. The thermal solution 600 includes a thermal attach block 610, a thermal transport device 620, which is attached to the thermal attach block 610, and a remote heat exchanger 630. The remote heat exchanger 630 is also attached to the thermal transport device 620. The thermal transport solution 600 also includes at least one electrically insulative fastener 650. As shown in FIG. 6, there are two electrically insulative fastener 650 and 652. Electrically insulative fastener 650, 652 can be made of an insulative material such as an electrically insulative plastic. In the alternative, the fasteners 650 and 652 can also be made of a conductive material that is provided with a non-conductive or electrically insulative material. The attach block 610 is attached to the semiconductor device 604 via a TIM 612. An electrical insulative portion 640 is provided between the semiconductor device 604 and the substrate 660 to which it is attached. Therefore, the semiconductor device 604, the attach block 610, the thermal transport device 620, and the remote heat exchanger 630 are all at the same electrical potential, and a voltage may be placed on to the semiconductor device 604 of sufficient size to prevent or substantially eliminate leakage current in the semiconductive device.

A package includes a semiconductor device 204, 304, 504, 604 that produces heat during operation, a thermal solution 200, 300, 400, 500, 600 is thermally coupled to the semiconductor device 204, 304, 504, 604 to remove heat generated by the semiconductor device 204, 304, 504, 604 at a rate sufficient to keep the semiconductor device below a selected threshold temperature, and a device 240, 340, 342, 540, 640 for electrically isolating at least the semiconductor device 204, 304, 504, 604. The package also includes a biasing device for applying a voltage to a body of the semiconductor device 204, 304, 504, 604. The biasing device applies a voltage to reduce leakage current in the semiconductor device. The biasing device applies a voltage which leaves thermal solution 200, 300, 400, 500, 600 substantially unaffected. In some embodiments, the thermal solution 200, 300, 400, 500, 600 further includes an attach block 210, 310, 410, 510, 610 for attaching to the semiconductor device 204, 304, 504, 604.

The attach block 210, 310, 410, 510, 610 includes a first attach block portion, and a second attach block portion. The thermal solution 200, 300, 400, 500, 600 also includes a thermal transport device 220, 320, 520, 620 attached to the attach block 210, 310, 410, 510, 610. The device for electrically isolating at least the semiconductor device includes an electrical insulation portion 240, 340, 342, 540, 640 for electrically isolating a first portion 311, 411 of an attach block from a second portion 313, 413 of an electrical attach block 310, 410. In another example embodiment, the thermal solution 500 further includes an attach block 510 for attaching to the semiconductor device 504, and a thermal transport device 520 attached to the attach block 510. In this example embodiment, the device 540 for electrically isolating at least the semiconductor device 504 includes an electrical insulation portion 540 for electrically isolating the attach block 511 from the thermal transport portion 520. The electrical insulation portion 540 for electrically isolating the attach block from the thermal transport portion may include a layer of diamond material.

In another embodiment, the thermal solution 200 for the package includes an attach block 210 for attaching to the semiconductor device 204, and a thermal transport device 220 attached to the attach block 210. The thermal transport device 220 includes a first thermal transport portion 221, and a second thermal transport portion 222, wherein means for electrically isolating at least the semiconductor device includes an electrical insulation portion 240 for electrically isolating the first thermal transport portion 221 from the second thermal transport portion 222. In another example embodiment, the thermal solution 600 further includes an attach block 610 for attaching to the semiconductor device 604, and a thermal transport device attached to the attach block 610. The thermal transport device 620 the attach block 610 and the semiconductor device 604 are substantially electrically isolated from an electrical ground. In one example embodiment, the attach block 610 is connected to a substrate, such as a mother board, with at least one electrically nonconductive fastener 650, which in some embodiments may be a plastic fastener.

Figure 7:
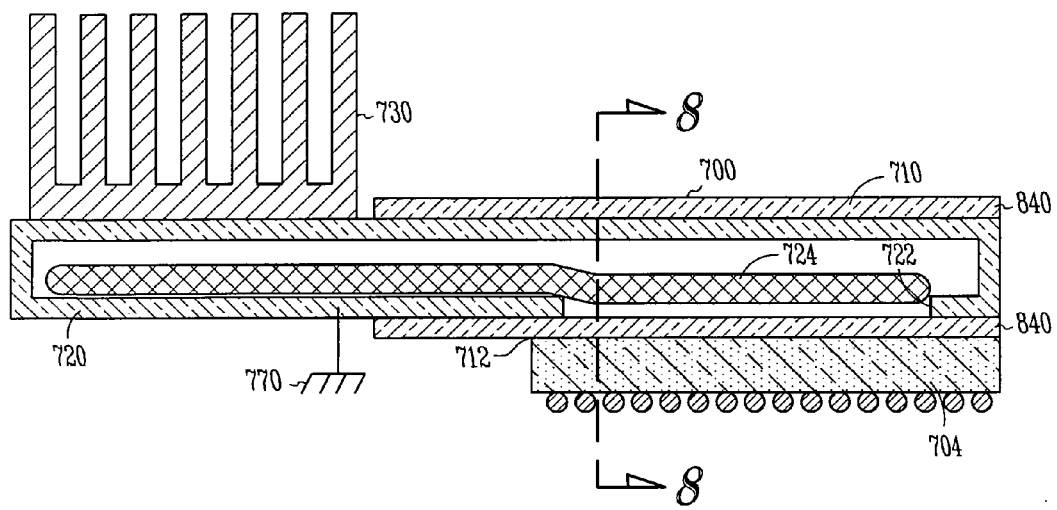
FIG. 7 is a schematic view of a thermal solution attached to a device, according to an example embodiment.
Figure 8:
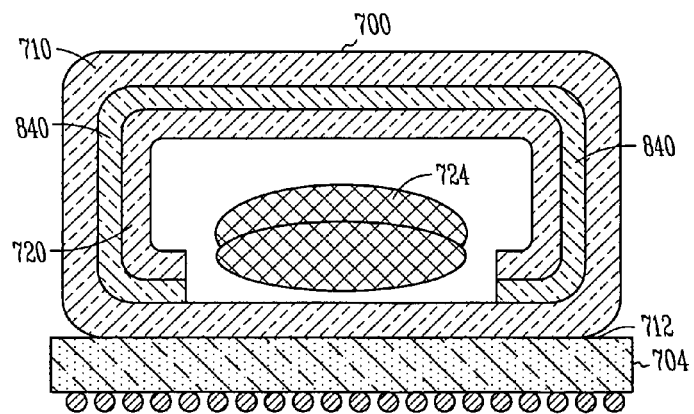
FIG. 8 is a cross-sectional schematic view of a thermal solution attached to a device along line 8-8 of FIG. 7, according to an example embodiment.

FIG. 7 and FIG. 8 show another embodiment of a thermal solution 700, according to an example embodiment. FIG. 7 is a schematic view of a thermal solution 700, while FIG. 8 is a cross-sectional schematic view of a thermal solution 700 along line 8-8 of FIG. 7. Now referring to both FIG. 7 and FIG. 8, the thermal solution 700 will be detailed. The thermal solution 700 is attached to a semiconductor device 704 using a TIM 712. The thermal solution 700 includes a copper sleeve 710, a heat pipe 720, and a remote heat exchanger 730. The remote heat exchanger 730 is attached to the heat pipe 720. The heat pipe 720 includes an opening 722 therein. The copper sleeve 710 includes a surface for attaching to a major surface or the backside of a semiconductor device 704. The heat pipe, and specifically the opening, 722 within the heat pipe 720 is attached to the sleeve 710 so that the opening 722 and the heat pipe 720 is near the backside surface of the semiconductor device 704. The heat pipe 720 is attached to the sleeve 710 using an electrically insulative material such as epoxy. Therefore, the heat pipe 720 is electrically isolated or substantially electrically isolated from the sleeve 710. The heat pipe 720 and the attached remote heat exchanger 730 can then be grounded as depicted by ground connection 770 shown in FIG. 7, without grounding the sleeve 710 and the semiconductor device 704. To remove heat from the semiconductor device, the heat passes through the sleeve 710 and then to the fluid or coolant within the heat pipe and specifically within the wick 724 of the heat pipe 720. It should be noted that the sleeve 710 surrounds or envelopes the heat pipe 720. Therefore, additional heat can be removed by passing through the insulative material 840 and the outside body of the heat pipe 720. It should be noted that the layer of insulative material 840 is made as thin as possible to reduce the thermal resistance, R. In addition, the surface area between the heat pipe 720 and the sleeve 710 is relatively large to further reduce the thermal resistance, R, between the heat pipe 720 and the sleeve 710.

At least a portion of the heat pipe 720 is dimensioned to fit within the external sleeve 710. The heat pipe 720 is attached within the external sleeve 710 while being substantially electrically isolated from the external sleeve 710. In some example embodiments, such as shown in FIG. 7, the heat exchanger 730 includes a plurality of fins. In some embodiments, the external sleeve 710 is made of copper, or the heat pipe 720 is made of copper. In some embodiments, a thermal interface material 712 is attached to a surface of the external sleeve 710, and a semiconductor device 704 is attached to the external sleeve 710. The thermal interface material 712 is sandwiched between the sleeve 710 and the semiconductor device 704.

Figure 9:
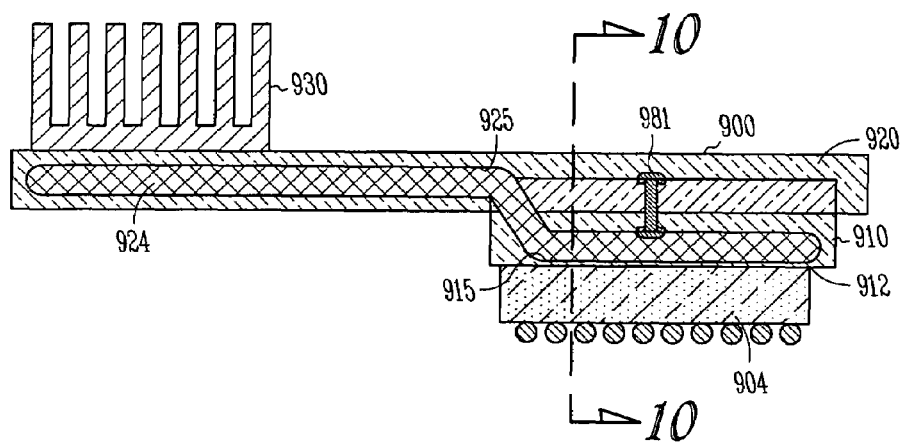
FIG. 9 is a schematic view of a thermal solution attached to a device, according to an example embodiment.
Figure 10:
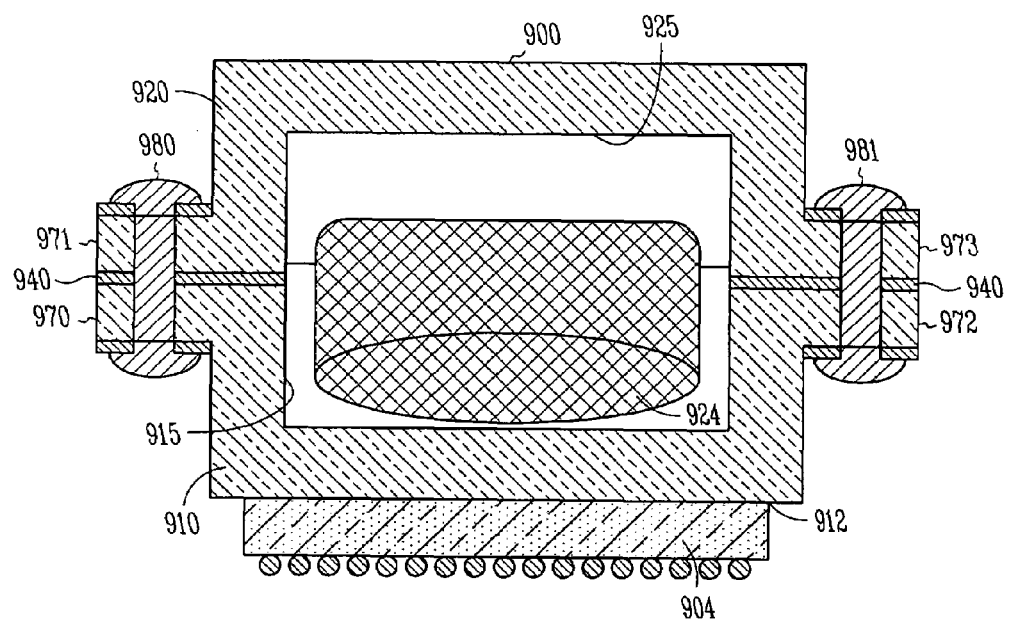
FIG. 10 is a cross-sectional schematic view of a thermal solution attached to a device along line 10-10 of FIG. 9, according to an example embodiment.

FIGS. 9 and 10 illustrate schematic views of another thermal solution 900, according to an example embodiment. FIG. 9 is a schematic view of the thermal solution 900 attached to a semiconductor device 904, and FIG. 10 is a cross-sectional schematic view of the thermal solution 900 attached to the semiconductor device 904 along line 10-10 in FIG. 9. The thermal solution 900 will now be further discussed and detailed with respect to FIGS. 9 and 10. The thermal solution 900 includes an attachment portion 910 and a thermal transport portion 920. The attachment portion 910 is attached to the semiconductor device 904 using a thermal interface material or TIM 912. The attachment portion 910 also includes a cavity 915. The thermal transport portion 920 also includes a cavity 925.

When the thermal attachment portion 910 is attached to the thermal transport portion 920, the cavities 915 and 925 form a continuous cavity having portions near the semiconductor device as well as near the remote heat exchanger 930. The cavities 915 and 925 also include a wick 924. The wick carries a fluid in either liquid or gaseous form. The attachment portion 910 and the thermal transport portion 920, when attached, essentially form a heat pipe for removing heat from the backside of the semiconductor device 904 and transporting the removed heat to the remote heat exchanger 930. The attachment portion 910 and the thermal transport portion 920 are attached so that they are electrically isolated from one another by an electrical isolation layer 940. Each of the attachment portion 910 and the transport portion 920 of the solution 900 include attachment wings 970, 971, 972, 973. The attachment wings 970, 971, 972, 973 each have openings therein. The openings 970 and 971 align and the openings 972 and 973 align to receive fasteners 980 and 981. The fasteners 980, 981 can be non-electrically conductive or substantially non-electrically conductive. For example, in one example embodiment, the fasteners 981, 980 are plastic fasteners. In another embodiment, the fasteners 980, 981 are made of conductive material but the portions of the fastener that could be conductive or serve as a conductor between the attachment portion 910 and the thermal transport portion 920 are rendered non-conductive by a layer of non-conductive material.

The electrical insulator 940 is positioned between a first attachment portion 910 and a second attachment portion 920. The fastener 980, 981 is substantially electrically isolated from the first attachment portion 910 and the second attachment portion 920.

Figure 11:
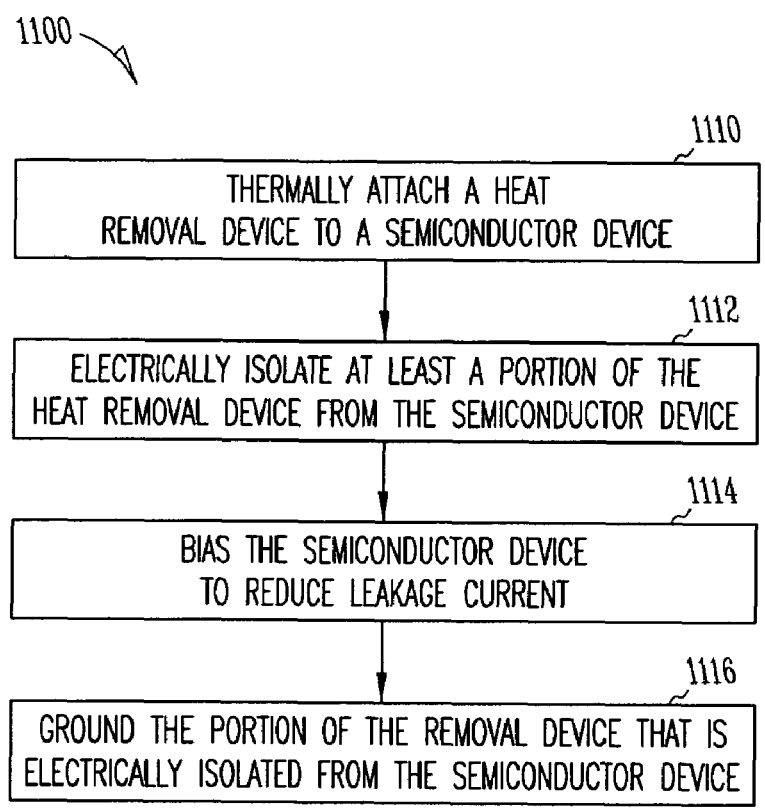
FIG. 11 is a flowchart of a method for implementing a thermal solution, according to an example embodiment.

FIG. 11 is a flowchart of a method 1100 for implementing a thermal solution, according to an example embodiment. The method 1100 includes thermally attaching a heat removal device to a semiconductor device 1110, and electrically isolating at least a portion of the heat removal device from the semiconductor device 1112. The method 1100 also includes biasing the semiconductor device to reduce leakage current 1114. The method 1100 also includes grounding the portion of the heat removal device that is electrically isolated from the semiconductor device 1116. Electrically isolating the at least one portion of the heat removal device 1112 includes electrically isolating a first portion of an attach block from a second portion of an electrical attach block, or electrically isolating a first portion of an heat transport from a second portion of the heat transport, or electrically isolating an attach block from the semiconductor device. In some example embodiments, a layer of diamond material is used to electrically isolate an attach block from the semiconductor device.

A system 100 includes a central processing unit 104, and a thermal solution 3000 in thermal communication with the central processing unit 104. The thermal solution 3000 includes at least a portion of an attach block 3010 attached to the central processing unit 104. Another portion of the thermal solution 3000 is attached to the portion of the attach block 3010 yet is electrically isolated from the portion of attach block 3010. The system 100 also includes a display 112 in electrical communication with the central processing unit 104. The display 112 receives input from the central processing unit 104. The system 100 also includes an apparatus for biasing the central processing unit and the portion of attach block 3010 attached to the central processing unit 104 to reduce leakage current. A remote heat exchanger 3030 is thermally coupled to the another portion of the thermal solution 3000.

It is understood that the above description is intended to be illustrative, and not restrictive. Many other embodiments will be apparent to those of skill in the art upon reviewing the above description. The scope of the invention should be, therefore, determined with reference to the appended claims, along with the full scope of equivalents to which such claims are entitled.

What is claimed is:

1. A package comprising:
   a thermal solution to thermally couple to a semiconductor device to remove heat generated by the semiconductor device;
   an electrical isolator to electrically isolate at least a portion of the thermal solution from the semiconductor device; and
   a biasing device to apply a voltage to a body of the semiconductor device;
   an attach block to attach to the semiconductor device, wherein the attach block includes a first attach block portion, and a second attach block portion; and
   a thermal transport device attached to the attach block, wherein the electrical isolator includes an electrical insulation portion to electrically isolate the first attach block portion from the second attach block portion.

2. The package of claim 1 wherein the biasing device is to apply a voltage to reduce leakage current in the semiconductor device.

3. A package comprising:
   a thermal solution to thermally couple to a semiconductor device to remove heat generated by the semiconductor device;
   an electrical isolator to electrically isolate at least a portion of the thermal solution from the semiconductor device; and
   a biasing device to apply a voltage to a body of the semiconductor device;
   an attach block to attach to the semiconductor device; and
   a thermal transport device attached to the attach block, wherein the electrical isolator includes an electrical insulation portion for electrically isolating the attach block from the thermal transport portion.

4. The package of claim 3 wherein the biasing device is to apply a voltage which leaves the thermal solution substantially unaffected.

5. A package comprising:
   a thermal solution to thermally couple to a semiconductor device to remove heat generated by the semiconductor device;
   an electrical isolator to electrically isolate at least a portion of the thermal solution from the semiconductor device; and
   a biasing device to apply a voltage to a body of the semiconductor device;
   an attach block to attach to the semiconductor device; and
   a thermal transport device attached to the attach block, wherein the thermal transport device includes a first thermal transport portion, and a second thermal transport portion, wherein the electrical isolator includes an electrical insulation portion to electrically isolate the first thermal transport portion from the second thermal transport portion.

6. A package comprising:
   a thermal solution to thermally couple to a semiconductor device to remove heat generated by the semiconductor device;
   an electrical isolator to electrically isolate at least a portion of the thermal solution from the semiconductor device; and
   a biasing device to apply a voltage to a body of the semiconductor device;
   an attach block to attach to the semiconductor device; and
   a thermal transport device to attach to the attach block, wherein the thermal transport device, the attach block and the semiconductor device are substantially electrically isolated from an electrical ground.

7. The package of claim 6, wherein the attach block is to connect to a mother board with at least one electrically non-conductive fastener.

8. The package of claim 6, wherein the attach block is to connect to a mother board with at least one plastic fastener.

9. A package comprising:
   a thermal solution to thermally couple to a semiconductor device to remove heat generated by the semiconductor device, wherein the semiconductor device is a central processing unit;
   an electrical isolator to electrically isolate at least a portion of the thermal solution from the semiconductor device; and
   a biasing device to apply a voltage to a body of the semiconductor device.

10. A package comprising:
    a thermal solution to thermally couple to a semiconductor device to remove heat generated by the semiconductor device;

an electrical isolator to electrically isolate at least a portion of the thermal solution from the semiconductor device; and
a biasing device to apply a voltage to a body of the semiconductor device; and
a remote heat exchanger thermally coupled to a portion of the thermal solution.

11. The package of claim 9 wherein the package is part of a system, the system further comprising a display in electrical communication with the central processing unit, the display receiving input from the central processing unit.

* * * * *